United States Patent
Tateishi

(10) Patent No.: US 12,001,128 B2
(45) Date of Patent: Jun. 4, 2024

(54) LIGHT SOURCE UNIT FOR PROJECTION TYPE DISPLAY APPARATUS

(71) Applicant: SONY GROUP CORPORATION, Tokyo (JP)

(72) Inventor: Ryo Tateishi, Tokyo (JP)

(73) Assignee: SONY GROUP CORPORATION, Tokyo (JP)

( * ) Notice: Subject to any disclaimer, the term of this patent is extended or adjusted under 35 U.S.C. 154(b) by 189 days.

(21) Appl. No.: 17/310,550

(22) PCT Filed: Jan. 27, 2020

(86) PCT No.: PCT/JP2020/002676
§ 371 (c)(1),
(2) Date: Aug. 10, 2021

(87) PCT Pub. No.: WO2020/170717
PCT Pub. Date: Aug. 27, 2020

(65) Prior Publication Data
US 2022/0107555 A1    Apr. 7, 2022

(30) Foreign Application Priority Data

Feb. 19, 2019  (JP) ................................. 2019-027480

(51) Int. Cl.
*G03B 21/16*  (2006.01)
*G09G 3/00*   (2006.01)
(Continued)

(52) U.S. Cl.
CPC ............. *G03B 21/16* (2013.01); *G09G 3/002* (2013.01); *G09G 3/36* (2013.01); *H05K 7/20136* (2013.01);
(Continued)

(58) Field of Classification Search
CPC .......... G03B 21/16; G09G 3/002; G09G 3/36; H05K 7/20136; H05K 7/20336; H05K 7/2039

See application file for complete search history.

(56) References Cited

U.S. PATENT DOCUMENTS 7,682,048 B2 * 3/2010 Hsu ........................... F21K 9/00
                                                       362/264
7,866,852 B2 * 1/2011 Kulkarni ................ G03B 21/16
                                                       362/373

(Continued)

FOREIGN PATENT DOCUMENTS

CN      101364006 A      2/2009
CN      103874883 A      6/2014
                (Continued)

OTHER PUBLICATIONS

International Search Report and Written Opinion of PCT Application No. PCT/JP2020/002676, dated Mar. 31, 2020, 11 pages of ISRWO.

*Primary Examiner* — Bao-Luan Q Le
(74) *Attorney, Agent, or Firm* — CHIP LAW GROUP

(57) ABSTRACT

A light source unit according to one embodiment of the present disclosure includes a base member having one face and another face that face each other, and having a first region and a second region that are disposed side by side, a first light-emitting element group disposed in the first region of the one face, a second light-emitting element group disposed in the second region of the one face, and having substantially the same heat generation amount as the first light-emitting element group, a first heat dissipation structure provided in the first region, and a second heat dissipation structure provided in the second region, and having a (Continued)

heat dissipation characteristic equal to or greater than a heat dissipation characteristic of the first heat dissipation structure.

15 Claims, 18 Drawing Sheets

(51) Int. Cl.
    *G09G 3/36*     (2006.01)
    *H05K 7/20*     (2006.01)

(52) U.S. Cl.
    CPC ....... *H05K 7/20336* (2013.01); *H05K 7/2039* (2013.01)

(56) References Cited

U.S. PATENT DOCUMENTS

| | | | | |
|---|---|---|---|---|
| 7,967,475 | B2* | 6/2011 | Kwon | G03B 21/16 |
| | | | | 362/249.02 |
| 8,534,874 | B2* | 9/2013 | Hayashi | H04N 9/3144 |
| | | | | 362/294 |
| 9,983,466 | B2* | 5/2018 | Fukuda | F21V 29/60 |
| 10,788,738 | B2* | 9/2020 | Yamaya | H05K 7/2039 |
| 2009/0040417 | A1 | 2/2009 | Nagaoka et al. | |
| 2009/0059580 | A1* | 3/2009 | Kwon | G03B 21/16 |
| | | | | 362/231 |
| 2009/0059582 | A1* | 3/2009 | Kulkarni | G03B 21/16 |
| | | | | 362/234 |
| 2009/0153805 | A1* | 6/2009 | Li | G03B 21/16 |
| | | | | 353/57 |
| 2009/0161354 | A1* | 6/2009 | Hsu | F21V 29/75 |
| | | | | 362/227 |
| 2010/0290011 | A1* | 11/2010 | Chen | G03B 21/16 |
| | | | | 362/231 |
| 2011/0249444 | A1* | 10/2011 | Hayashi | F21V 29/80 |
| | | | | 362/294 |
| 2012/0133907 | A1* | 5/2012 | Otani | G03B 21/16 |
| | | | | 165/104.34 |
| 2012/0299801 | A1* | 11/2012 | Kitano | F21K 9/00 |
| | | | | 362/249.02 |
| 2013/0088871 | A1 | 4/2013 | Yun et al. | |
| 2013/0112373 | A1* | 5/2013 | Fukai | H01L 23/3672 |
| | | | | 165/185 |
| 2014/0340652 | A1* | 11/2014 | Shimizu | G03B 21/16 |
| | | | | 353/52 |
| 2015/0168082 | A1* | 6/2015 | Huang | H01L 23/427 |
| | | | | 165/185 |
| 2016/0290608 | A1* | 10/2016 | Ohashi | F21V 29/75 |
| 2017/0059973 | A1 | 3/2017 | Yamaguchi | |
| 2017/0277027 | A1* | 9/2017 | Fukuda | F28D 15/0275 |
| 2019/0369469 | A1 | 12/2019 | Ishige et al. | |
| 2020/0004119 | A1* | 1/2020 | Yamaya | G02B 7/008 |

FOREIGN PATENT DOCUMENTS

| | | |
|---|---|---|
| CN | 205664125 U | 10/2016 |
| CN | 110073144 A | 7/2019 |
| EP | 2767758 A1 | 8/2014 |
| JP | 2009-042362 A | 2/2009 |
| JP | 3163765 U | 10/2010 |
| JP | 2011-154855 A | 8/2011 |
| JP | 2013-084574 A | 5/2013 |
| JP | 2013-140804 A | 7/2013 |
| JP | 2015-103335 A | 6/2015 |
| JP | 2015-111540 A | 6/2015 |
| JP | 2017-045002 A | 3/2017 |
| JP | 2017-062885 A | 3/2017 |
| JP | 2018-113229 A | 7/2018 |
| JP | 2018-120762 A | 8/2018 |
| KR | 10-1245342 B1 | 3/2013 |
| WO | 2013/055018 A1 | 4/2013 |
| WO | 2015/076258 A1 | 5/2015 |
| WO | 2018/116689 A1 | 6/2018 |
| WO | 2019/012703 A1 | 1/2019 |

\* cited by examiner

LIGHT SOURCE UNIT FOR PROJECTION TYPE DISPLAY APPARATUS

CROSS REFERENCE TO RELATED APPLICATIONS

This application is a U.S. National Phase of International Patent Application No. PCT/JP2020/002676 filed on Jan. 27, 2020, which claims priority benefit of Japanese Patent Application No. JP 2019-027480 filed in the Japan Patent Office on Feb. 19, 2019. Each of the above-referenced applications is hereby incorporated herein by reference in its entirety.

TECHNICAL FIELD

The present disclosure relates to a light source unit having a plurality of light-emitting element groups and a projection-type display apparatus including the same.

BACKGROUND ART

In recent years, in a projection-type display apparatus, a light source unit having, as light sources, a plurality of high-power light-emitting elements such as light-emitting diodes has been used. For example, Patent Literature 1 discloses a light source unit that improves a reduction of luminance and life by determining the order of cooling through utilization of a difference in upper limit temperature between respective LED light sources.

CITATION LIST

Patent Literature

Patent Literature 1: Japanese Unexamined Patent Application Publication No. 2011-154855

SUMMARY OF THE INVENTION

What is thus desired is an improvement in performance.

It is desirable to provide a light source unit and a projection-type display apparatus that make it possible to improve performance.

A light source unit according to one embodiment of the present disclosure includes: a base member having one face and another face that face each other, and having a first region and a second region that are disposed side by side; a first light-emitting element group disposed in the first region of the one face; a second light-emitting element group disposed in the second region of the one face, and having substantially the same heat generation amount as the first light-emitting element group; a first heat dissipation structure provided in the first region; and a second heat dissipation structure provided in the second region, and having a heat dissipation characteristic equal to or greater than a heat dissipation characteristic of the first heat dissipation structure.

A projection-type display apparatus according to one embodiment of the present disclosure includes: a light source unit; an image generation optical system that generates image light, by modulating light from the light source unit on the basis of an inputted image signal; and a projection optical system that projects the image light generated by the image generation optical system. The projection-type display apparatus includes, as the light source unit, the light source unit according to one embodiment of the present disclosure described above.

In the light source unit according to one embodiment of the present disclosure and the projection-type display apparatus according to one embodiment of the present disclosure, the first region in which the first light-emitting element group is disposed and the second region in which the second light-emitting element group is disposed respectively include the first heat dissipation structure and the second heat dissipation structure. The first light-emitting element group and the second light-emitting element group have the substantially the same heat generation amount. The second heat dissipation structure has a higher heat dissipation efficiency than the first heat dissipation structure. Thus, a cooling efficiency in the second region is improved.

MODES FOR CARRYING OUT THE INVENTION

Figure 1:
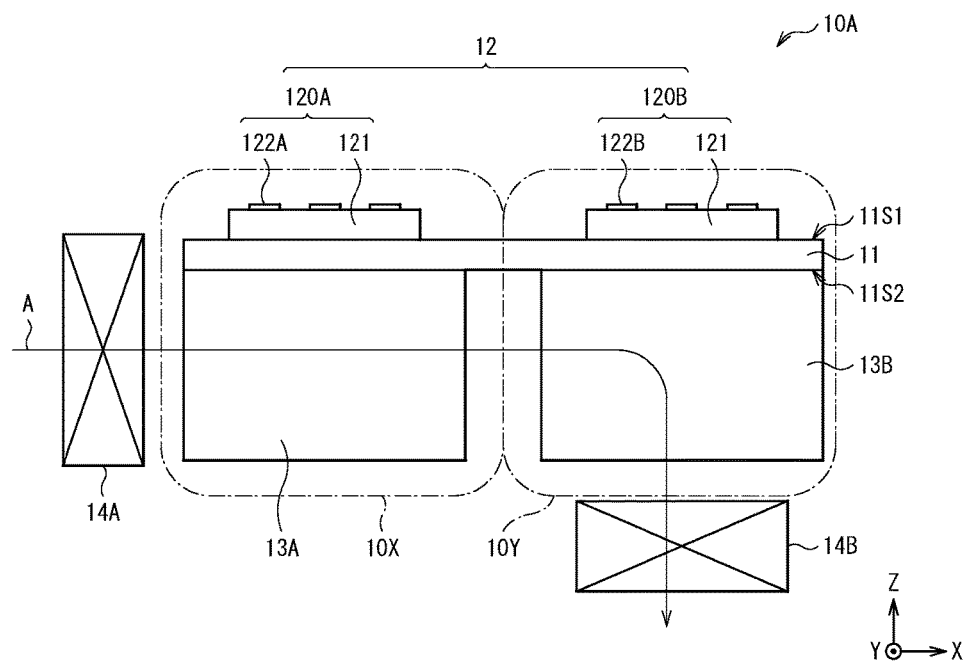
FIG. 1 is a side diagram illustrating an example of a configuration of a light source unit according to a first embodiment of the present disclosure.

Hereinafter, embodiments of the present disclosure will be described in detail with reference to the drawings. The following description is one concrete example of the present disclosure, and the present disclosure is not limited to the following embodiments. In addition, the present disclosure is not limited to arrangement, dimensions, dimensional ratios, and the like of the respective constituent elements illustrated in the drawings. It is to be noted that the description is given in the following order.
1. First Embodiment (an example in which more fins are disposed on a downstream side than an upstream side)
   1-1. Configuration of Light Source Unit
   1-2. Operation of Light Source Unit
   1-3. Workings and Effects
2. Second Embodiment (an example in which fins that include a material having a thermal conductivity higher than that of fins on the upstream side are disposed on the downstream side)
3. Third Embodiment (an example in which holes are provided on the fins on the downstream side)
4. Fourth Embodiment (an example in which an opening is provided between the upstream side and the downstream side of a base member)
5. Modification Examples
   5-1. Modification Example 1 (an example in which a hole density is varied from the upstream side to the downstream side)
   5-2. Modification Example 2 (an examples in which three light source sections are provided)
   5-3. Modification Example 3 (an example in which a heat pipe is combined)
6. Application Examples (examples of a projection-type display apparatus)

1. First Embodiment

1-1. Configuration of Light Source Unit

Figure 2:
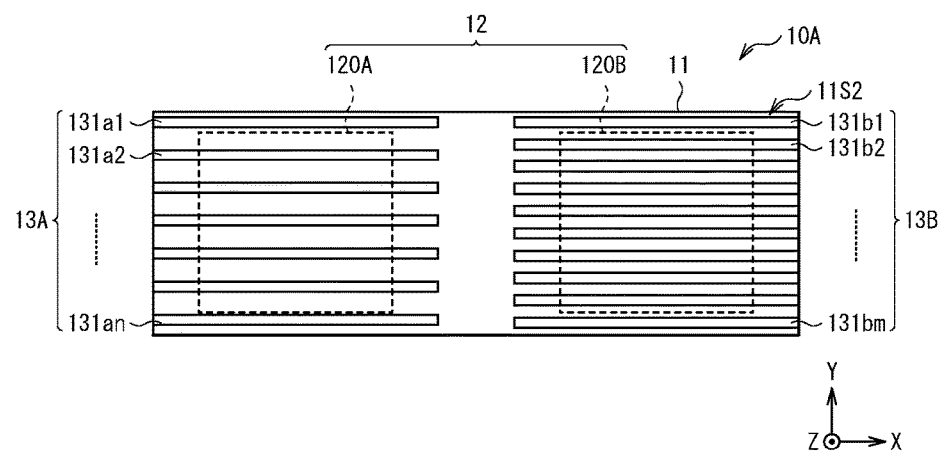
FIG. 2 is a schematic diagram illustrating a configuration of a main part of the light source unit illustrated in FIG. 1.

FIG. 1 illustrates an example of a configuration of a light source unit (a light source unit 10A) according to a first embodiment of the present disclosure. FIG. 2 schematically illustrates a configuration of a main part of the light source unit 10A illustrated in FIG. 1. It should be noted that FIG. 1 illustrates a configuration when viewed from in a gravitational direction, for example. The light source unit 10A is used, for example, as a light source of a projection-type display apparatus (a projector 1 illustrated in FIG. 18). The light source unit 10A has, for example, a base member 11, a light source section 12 having two light-emitting element groups 120A and 120B disposed, for example, on one face (a face 11S1) of the base member 11, two heat dissipation members 13A and 13B disposed, for example, on another face (a face 11S2) of the base member 11, and two fans 14A and 14B disposed upstream and downstream.

In the light source unit 10A according to the present embodiment, the base member 11 has a first region 10X in which the light-emitting element group 120A is disposed and a second region 10Y in which the light-emitting element group 120B is disposed. The first region 10X and the second region 10Y are disposed side by side in an X-axis direction, for example. The heat dissipation member 13A is further disposed in the first region 10X, and the heat dissipation member 13B having a higher heat dissipation characteristic than the heat dissipation member 13A is further disposed in the second region 10Y. The fan 14A is disposed on a first region 10X side and the fan 14B is disposed on a second region 10Y side. A cooling air generated by the fans 14A and 14B is fed from the first region 10X to the second region 10Y, for example, as indicated by an arrow A in FIG. 1. That is, the first region 10X and the second region 10Y are disposed on a flow path of the cooling air, and the first region 10X is disposed on an upstream side whereas the second region 10Y is disposed on a downstream side.

The base member 11 is for fixing the light-emitting element group 120A and the light-emitting element group 120B that structure the light source section 12, and is, for example, a plate-like member. In addition, the base member 11 also has a function as a heat sink. The base member 11 includes, for example, aluminum, copper, an alloy thereof, or the like. For example, the base member 11 may have a groove or the like to arrange a heat pipe. In addition, the base member 11 may have a configuration that uses a vapor chamber or the like, besides the plate-like member that includes a metal described above.

Figure 3:
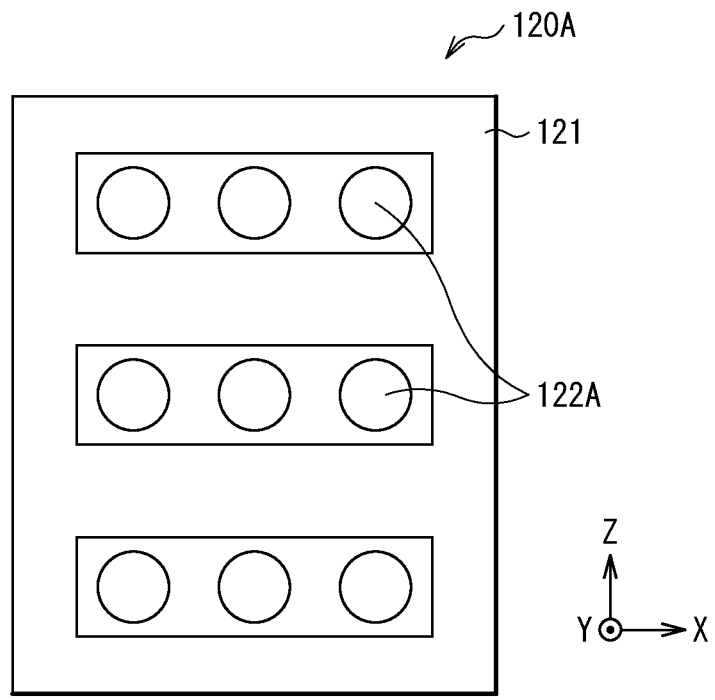
FIG. 3 is a schematic diagram illustrating an example of a configuration of a light source section illustrated in FIG. 1.

The light source section 12 has, for example, two light-emitting element groups 120A and 120B as described above. The light-emitting element group 120A and the light-emitting element group 120B are respectively disposed in the first region 10X and the second region 10Y on an upper face (the face 11S1) of the base member 11. The light-emitting element group 120A corresponds to one concrete example of a "first light-emitting element group" of the present disclosure, and the light-emitting element group 120B corresponds to one concrete example of a "second light-emitting element group" of the present disclosure. FIG. 3 schematically illustrates a configuration of, e.g., the light-emitting element group 120A of the light source section 12, and the light-emitting element group 120B has a similar configuration as well, for example. The light-emitting element groups 120A and 120B have, for example, substantially the same heat generation amount. The light-emitting element groups 120A and 120B have, as light sources, one or a plurality of light-emitting elements 122A and 122B that outputs light of a predetermined wavelength. The light-emitting elements 122A and 122B are, for example, semiconductor lasers that oscillate a laser having a wavelength of 445 nm or 455 nm. The light-emitting elements 122A and 122B are disposed on a base section 121 that includes, for example, aluminum (Al), and the base section 121 is fixed to the base member 11.

It should be noted that the light-emitting element groups 120A and 120B do not necessarily have to be configured by the same number of light-emitting elements 122A and 122B as long as the heat generation amount is substantially the same. In addition, the light-emitting element groups 120A and 120B may be configured by the light-emitting elements 122A and 122B that oscillate lasers having wavelengths that are different from each other. Alternatively, the light-emitting element group 120A and the light-emitting element group 120B each may be configured by two or more types of light-emitting elements that oscillate lasers of different wavelengths.

Figure 4:
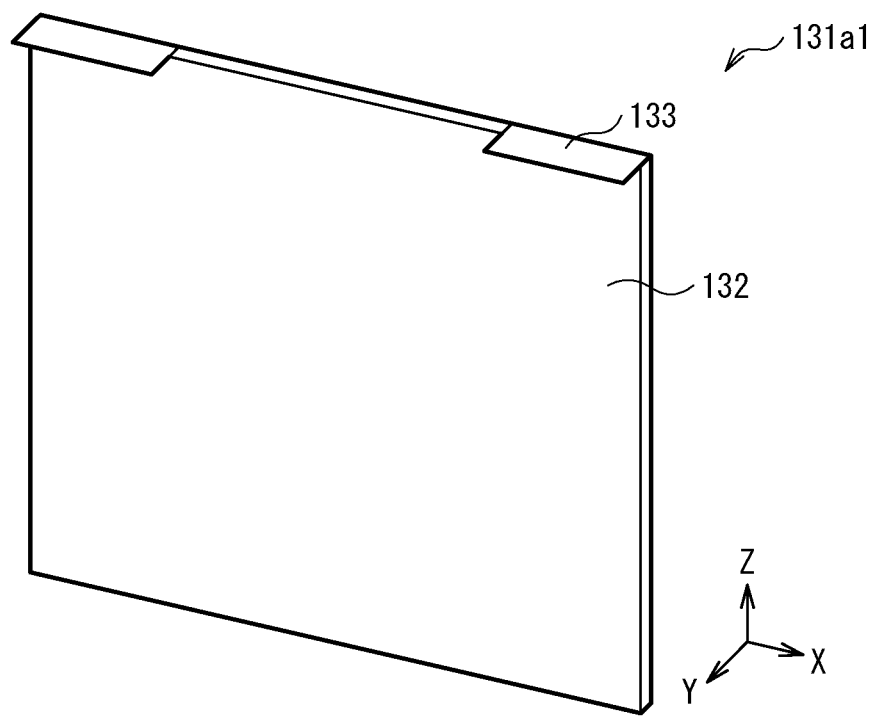
FIG. 4 is a perspective diagram illustrating a shape of a heat dissipation member illustrated in FIG. 1.

The heat dissipation member 13A and the heat dissipation member 13B are configured by one or a plurality of fins (e.g., fins 131$a$1, 131$a$2, . . . , 131$an$ and fins 131$b$1, 131$b$2, . . . , 131$bm$). The heat dissipation member 13A corresponds to one concrete example of a "first heat dissipation structure" of the present disclosure, and the heat dissipation member 13B corresponds to one concrete example of a "second heat dissipation structure" of the present disclosure. FIG. 4 illustrates an example of a shape of a fin (e.g., the fin 131a1) structuring the heat dissipation member 13A, and other fins (the fins 131a2, . . . , 131an) structuring the heat dissipation member 13A and the fins (the fins 131b1, 131b2, . . . , 131bm) structuring the heat dissipation member 13B have similar shapes. The fin 131a has, for example, a rectangular heat dissipation face 132. An attachment section 133 is provided at both ends of one side of the heat dissipation face 132, and is fixed to the base member 11 via the attachment section 133.

The heat dissipation member 13A is for releasing a heat generated by the light-emitting element group 120A. The respective fins 131a1, 131a2, . . . , 131an structuring the heat dissipation member 13A are disposed at a position corresponding to the first region 10X of a lower face (the face 11S2) of the base member 11. Specifically, the heat dissipation member 13A is disposed on the lower face (the face 11S2) of the base member 11 which faces the light-emitting element group 120A. The respective fins 131a1, 131a2, . . . , 131an are, for example, stacked in a substantially perpendicular direction (e.g., in a Y-axis direction) with respect to a blowing direction of a cooling air fed from the fan 14A, allowing the cooling air to pass between the respective fins 131a1, 131a2, . . . , 131an. The fins 131a1, 131a2, . . . , 131an each preferably include, for example, a material having a high thermal conductivity, and preferably include, for example, a pure aluminum-based material, copper (Cu), carbon (C), or the like.

The heat dissipation member 13B is for releasing a heat generated by the light-emitting element group 120B. The respective fins 131b1, 131b2, . . . , 131bm structuring the heat dissipation member 13B are disposed at a position corresponding to the second region 10Y of the lower face (the face 11S2) of the base member 11. Specifically, the heat dissipation member 13B is disposed on the lower face (the face 11S2) of the base member 11 which faces the light-emitting element group 120B. The respective fins 131b1, 131b2, . . . , 131bm are, for example, stacked in a substantially perpendicular direction (e.g., in the Y-axis direction) with respect to the blowing direction of the cooling air fed from the fan 14A, allowing the cooling air to pass between the respective fins 131b1, 131b2, . . . , 131bm. The fins 131b1, 131b2, . . . , 131bm each preferably include, for example, a material having a high thermal conductivity, and preferably include, for example, a pure aluminum-based material, copper (Cu), carbon (C), or the like.

In the present embodiment, the heat dissipation member 13B has a heat dissipation characteristic equal to or higher than that of the heat dissipation member 13A, more preferably higher than that of the heat dissipation member 13A. Specifically, in the heat dissipation member 13B, it is desirable that the fins be disposed more densely than the heat dissipation member 13A. In other words, it is desirable that a pitch of the plurality of fins 131b1, 131b2, . . . , 131bm structuring the heat dissipation member 13B be narrower than a pitch of the plurality of fins 131a1, 131a2, . . . , 131an structuring the heat dissipation member 13A, and that the heat dissipation member 13B be configured by the fins more than those (m>n) of the heat dissipation member 13A. Thus, the heat dissipation member 13B has a higher heat dissipation characteristic than the heat dissipation member 13A, and a cooling efficiency of the second region 100Y is improved.

The fan 14A and the fan 14B are, for example, for generating an air flow (the cooling air) inside a duct (not illustrated) to cool the heat dissipation members 13A and 13B. The fan 14A is for blowing, for example, a cold air from the outside toward the heat dissipation members 13A and 13B, and is disposed on a heat dissipation member 13A side. The fan 14B is for discharging, to the outside, an air warmed by each of the heat dissipation members 13A and 13B inside the duct, for example, and is disposed on a heat dissipation member 13B side. Thus, the heat dissipation member 13A and the heat dissipation member 13B are cooled in this order.

1-2. Operation of Light Source Unit

In the light source unit 10, the first region 10X having the light-emitting element group 120A and the heat dissipation member 13A and the second region 10Y having the light-emitting element group 120B and the heat dissipation member 13B are disposed in this order on the flow path of the air (the cooling air) that flows from the fan 14A to the fan 14B. The fan 14A and the fan 14B are respectively coupled to a drive circuit 171 and a drive circuit 172. The drive circuits 171 and 172 each receive a control signal from a control section 173 which is based on a program recorded in a memory 174, and drive the fan 14A and the fan 14B on the basis of the control signal (see FIG. 18). The heat generated by the light-emitting element group 120A and the heat generated by the light-emitting element group 120B are respectively conducted to the heat dissipation member 13A and the heat dissipation member 13B through the base member 11. The heat dissipation member 13A and the heat dissipation member 13B are cooled by the cooling air fed from the fan 14A. The cooling air warmed by each of the heat dissipation members 13A and 13B is discharged to the outside from the fan 14B disposed on the second region 10Y side.

1-3. Workings and Effects

In the light source unit 10, the two light-emitting element groups 120A and 120B of substantially the same heat generation amount are disposed side by side on the upper face (the face 11S1) of the base member 11. The first region 10X in which the light-emitting element group 120A is disposed and the second region 10Y in which the light-emitting element group 120B is disposed are provided on the lower face (the face 11S2) of the base member 11. The heat dissipation member 13A is disposed in the first region 10X, and the heat dissipation member 13B having the higher heat dissipation characteristic than the heat dissipation member 13A is disposed in the second region 10Y. Thus, the cooling efficiency of the second region 10Y is improved and a temperature difference between the first region 10X and the second region 10Y is reduced. Hereinafter, workings and effects thereof will be described.

In a case where light sources of the same heat generation amount are disposed in order along a flow path of a cooling air, a downstream side of the cooling air tends to be higher in temperature than an upstream side of the cooling air. In general, life of a solid-state light source such as a light-emitting diode used as the light source is lowered by a temperature increase. Accordingly, the life of the light source disposed on the downstream side may possibly be shortened.

Further, the solid-state light source such as the light-emitting diode tends to involve a decrease in luminance by the temperature increase, and the light source luminance may possibly vary depending on positions accordingly.

In contrast, in the light source unit 10 according to the present embodiment, the heat dissipation member 13A and the heat dissipation member 13B are respectively disposed on the lower face (the face 1152) of the base member 11 for the two light-emitting element groups 120A (the first region 10X) and light-emitting element group 120B (the second region 10Y) of substantially the same heat generation amount that are disposed side by side on the upper face (the face 1151) of the base member 11. The light source unit 10 further has the two fans 14A and 14B. The fan 14A is disposed in front of the first region 10X and the fan 14B is disposed behind the second region 10Y, allowing the cooling air to flow from the fan 14A towards the fan 14B (the arrow A of FIG. 1). That is, the first region 10X is disposed on the upstream side of the flow path of the cooling air, and the second region 10Y is disposed on the downstream side of the flow path of the cooling air.

In the present embodiment, the heat dissipation member 13B has the higher heat dissipation characteristic than the heat dissipation member 13A. Specifically, the heat dissipation member 13A is configured by the plurality of fins 131a1, 131a2, ..., 131an, and the heat dissipation member 13B is configured by the plurality of fins 131b1, 131b2, ..., 131bm. The m-pieces of fins structuring the heat dissipation member 13B are disposed at the narrower pitch than the n-pieces of fins structuring the heat dissipation member 13A, and the heat dissipation member 13B is configured by more fins than the heat dissipation member 13A (m>n). Thus, the cooling efficiency of the second region 10Y is improved and the temperature difference between the first region 10X and the second region 10Y is reduced.

As described above, in the present embodiment, the heat dissipation member 13B having the higher heat dissipation characteristic than the heat dissipation member 13A, disposed in the first region 10X on the upstream side, is disposed in the second region 10Y on the downstream side, in the light source unit in which the two light-emitting element group 120A (the first region 10X) and light-emitting element group 120B (the second region 10Y) of substantially the same heat generation amount are disposed side by side. Thus, the temperature difference is reduced between the light-emitting element group 120A (and the light-emitting element 122A structuring the same) and the light-emitting element group 120B (and the light-emitting element 122B structuring the same) in the first region 10X and the second region 10Y, making it possible to improve performance as the light source unit.

Specifically, because the temperature difference between the light-emitting element group 120A and the light-emitting element group 120B is reduced, it is possible to reduce a difference in life between the light-emitting element 122A and the light-emitting element 122B structuring the light-emitting element group 120A and the light-emitting element group 120B. It should be noted here that the term "life" is defined as a time period during which the same illuminance is maintainable at a constant rate, or a time period during which the same illuminance as that at the time of starting of use is maintainable. In addition, it is possible to reduce variations in the luminance of the light-emitting element group 120A and the light-emitting element group 120B and to improve reliability.

Next, second to fourth embodiments of the present disclosure and modification examples 1 to 3 will be described. Components corresponding to the light source unit 10A of the above embodiment are denoted by the same reference numerals, and descriptions thereof are omitted.

2. Second Embodiment

Figure 5:
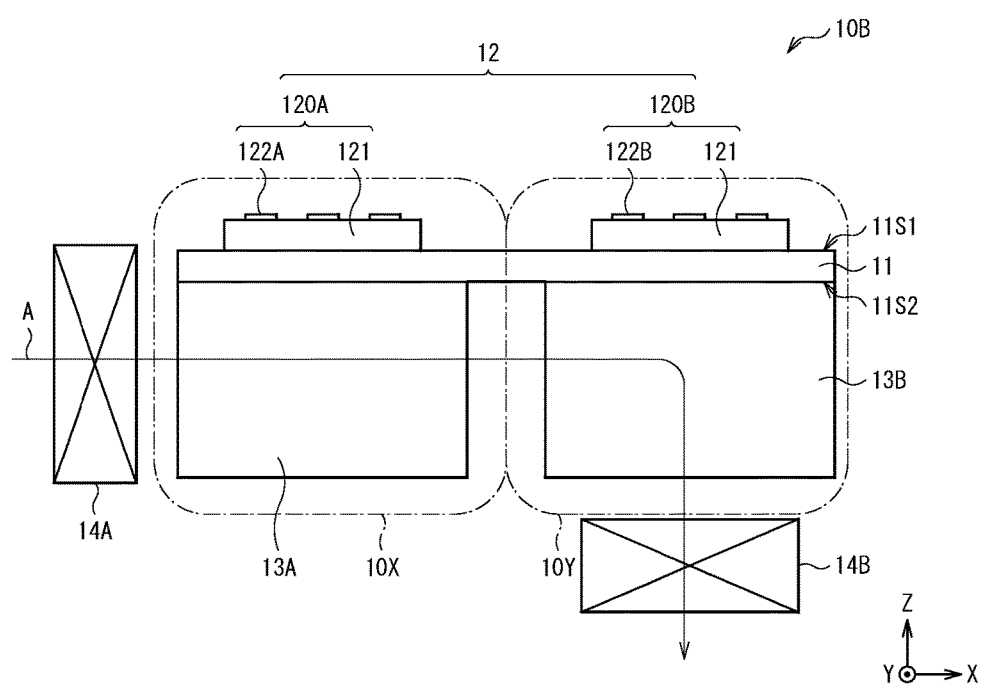
FIG. 5 is a side diagram illustrating an example of a configuration of a light source unit according to a second embodiment of the present disclosure.
Figure 6:
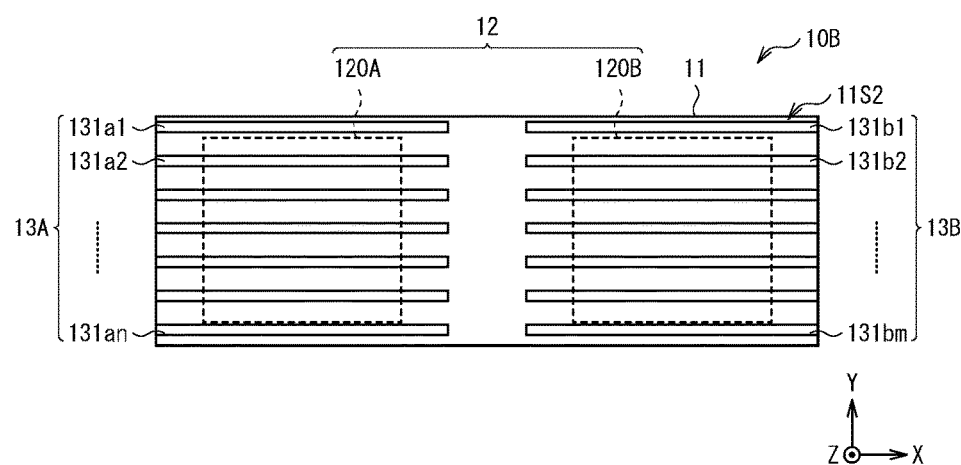
FIG. 6 is a schematic diagram illustrating a configuration of a main part of the light source unit illustrated in FIG. 5.

FIG. 5 illustrates an example of a configuration of a light source unit (a light source unit 10B) according to a second embodiment of the present disclosure. FIG. 6 schematically illustrates a configuration of a main part of the light source unit 10B illustrated in FIG. 5. The light source unit 10B is used, for example, as the light source of the projector 1 as with the light source unit 10A according to the first embodiment described above. The light source unit 10B according to the present embodiment differs from the first embodiment described above in that a material having a higher thermal conductivity than the plurality of fins 131a1, 131a2, ..., 131an structuring the heat dissipation member 13A is used for the plurality of fins 131b1, 131b2, ..., 131bm structuring the heat dissipation member 13B.

The heat dissipation member 13A and the heat dissipation member 13B are configured by one or the plurality of fins, and the respective fins are disposed, for example, at the same pitch as each other, as illustrated in FIG. 6. In other words, the heat dissipation member 13A and the heat dissipation member 13B are configured by, for example, the same number of fins (n=m).

Examples of materials structuring each of the fins 131a1, 131a2, ..., 131an of the heat dissipation member 13A and each of the fins 131b1, 131b2, ..., 131bm of the heat dissipation member 13B include a pure aluminum-based material, copper (Cu), and carbon (C) as described in the first embodiment described above. Among them, in a case where aluminum (Al), for example, is used as a constituent material of each of the fins 131a1, 131a2, ..., 131an, it is preferable that copper (Cu), for example, be used as a constituent material of each of the fins 131b1, 131b2, ..., 131bm. Thus, the heat dissipation member 13B has a higher heat dissipation characteristic than the heat dissipation member 13A.

As described above, in the present embodiment, the plurality of fins 131b1, 131b2, ..., 131bm structuring the heat dissipation member 13B is formed with use of a material having the higher thermal conductivity than the plurality of fins 131a1, 131a2, ..., 131an structuring the heat dissipation member 13A. Thus, as with the first embodiment described above, the temperature difference is reduced between the first region 10X and the second region 10Y, making it possible to improve performance as the light source unit.

3. Third Embodiment

Figure 7:
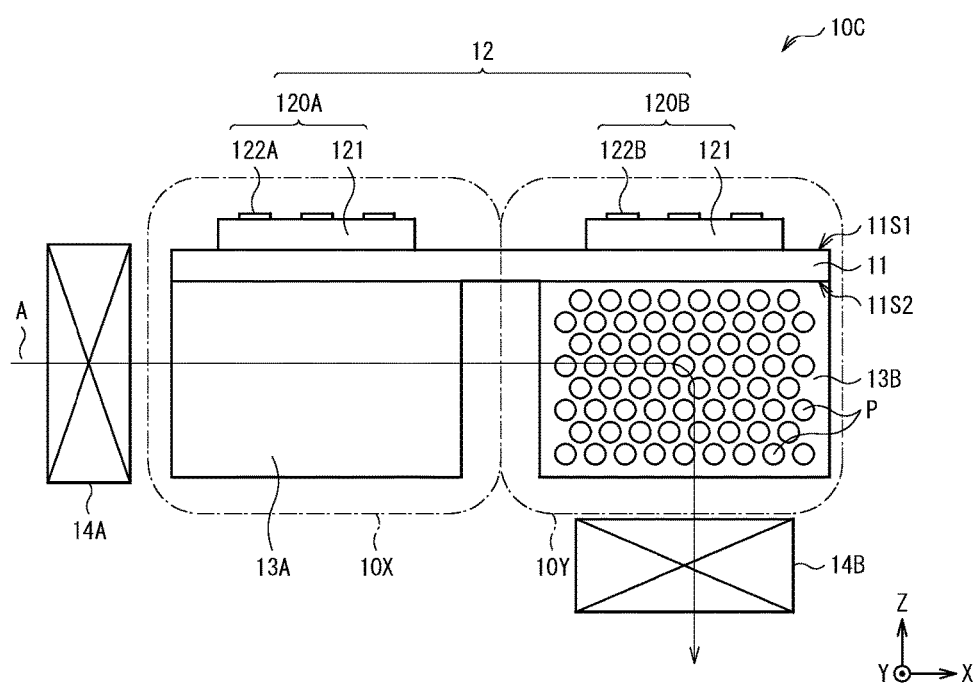
FIG. 7 is a side diagram illustrating an example of a configuration of a light source unit according to a third embodiment of the present disclosure.
Figure 8:
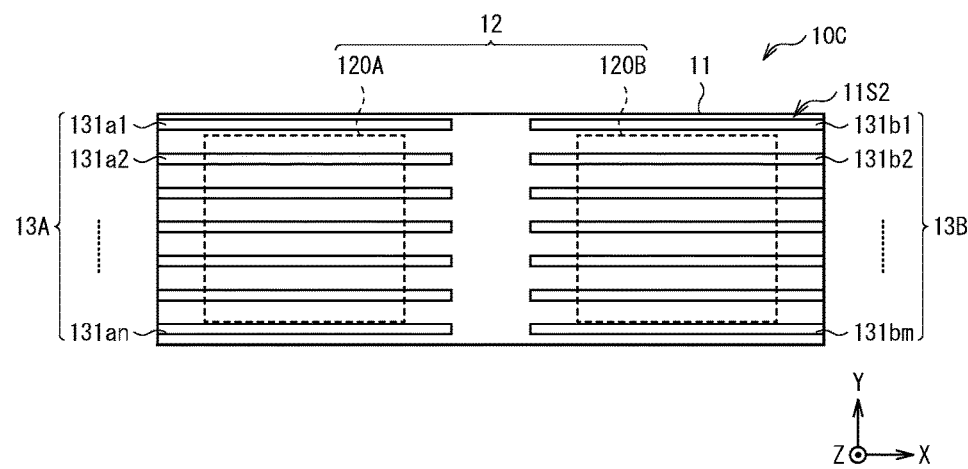
FIG. 8 is a schematic diagram illustrating a configuration of a main part of the light source unit illustrated in FIG. 7.

FIG. 7 illustrates an example of a configuration of a light source unit (a light source unit 10C) according to a third embodiment of the present disclosure. FIG. 8 schematically illustrates a configuration of a main part of the light source unit 10C illustrated in FIG. 7. The light source unit 10C is used, for example, as the light source of the projector 1 as with the light source unit 10A according to the first embodiment described above. The light source unit 10C according to the present embodiment differs from the first embodiment described above in that holes P are provided on the plurality of fins 131b1, 131b2, ..., 131bm structuring the heat dissipation member 13B.

Figure 9:
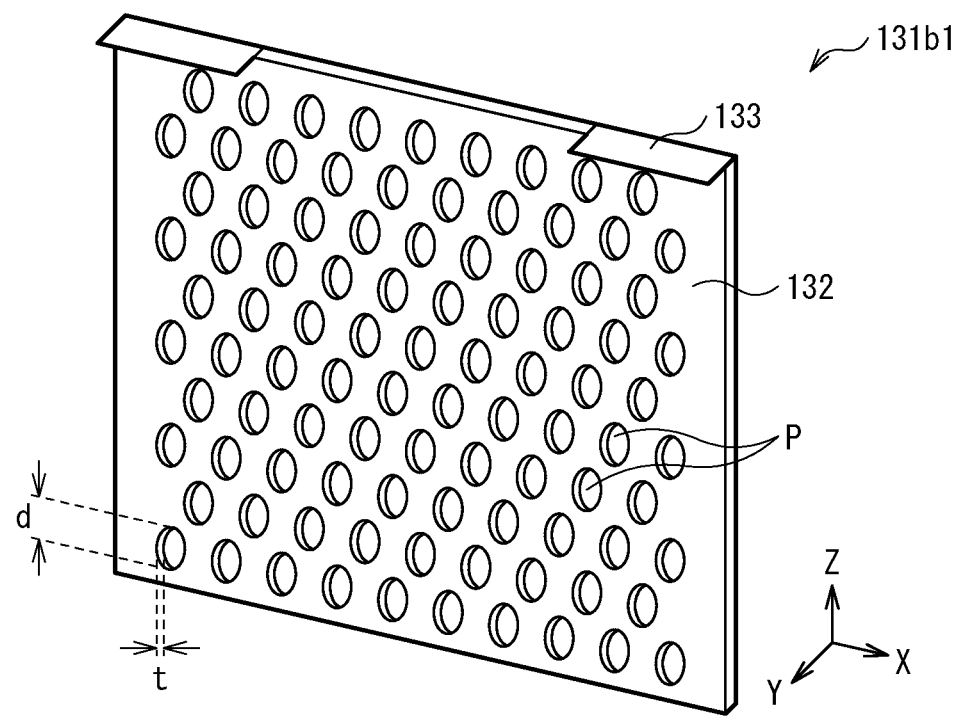
FIG. 9 is a perspective diagram illustrating a shape of a heat dissipation member illustrated in FIG. 7.
Figure 10:
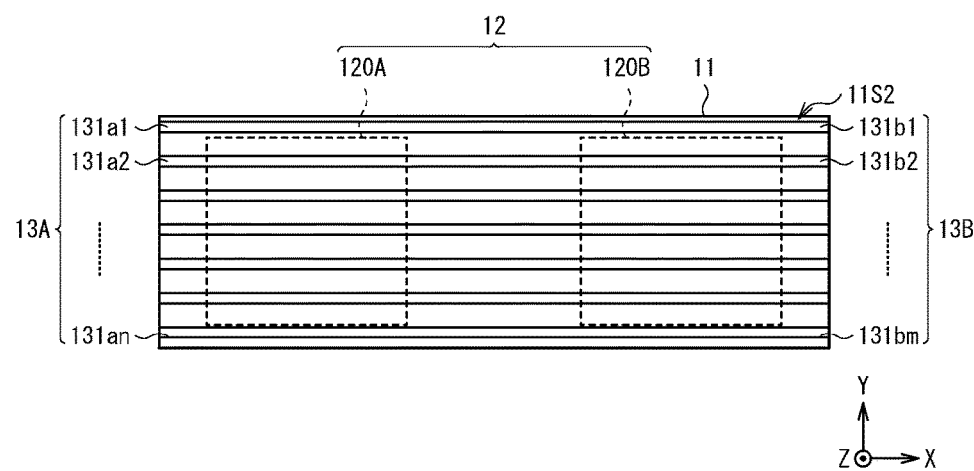
FIG. 10 is a schematic diagram illustrating another example of the configuration of the light source unit according to the third embodiment of the present disclosure.

FIG. 9 schematically illustrates a shape of each of the fins (e.g., 131b1) structuring the heat dissipation member 13B illustrated in FIG. 7. The hole P provided on the heat dissipation face 132 of each of the fins (e.g., 131b1) structuring the heat dissipation member 13B preferably satisfies, for example, a condition of d<2t (d: a hole diameter and t: a thickness of the fin). This allows the areas of side surfaces of the holes P formed by providing the holes P to be larger than the area of the heat dissipation face 132 reduced by providing the holes P. That is, the surface area of the heat dissipation face 132 increases, allowing the heat dissipation member 13B to have a higher heat dissipation characteristic than the heat dissipation member 13A.

As described above, in the present embodiment, the holes P are provided on the plurality of fins 131b1, 131b2, . . . , 131bm structuring the heat dissipation member 13B to increase the surface area of each of the fins 131b1, 131b2, . . . , 131bm. Thus, as with the first embodiment described above, the temperature difference is reduced between the first region 10X and the second region 10Y, making it possible to improve performance as the light source unit.

It should be noted that, although FIG. 7 illustrates an example in which the heat dissipation member 13A and the heat dissipation member 13B are provided independently of each other, each of the fins 131a1, 131a2, . . . , 131an and each of the fins 131b1, 131b2, . . . , 131bm may be configured by one sheet of fin which is continuous to each other, in a case where the respective fins structuring the heat dissipation member 13A and the heat dissipation member 13B include the same material and disposed at the same pitch as in the present embodiment.

4. Fourth Embodiment

Figure 11:
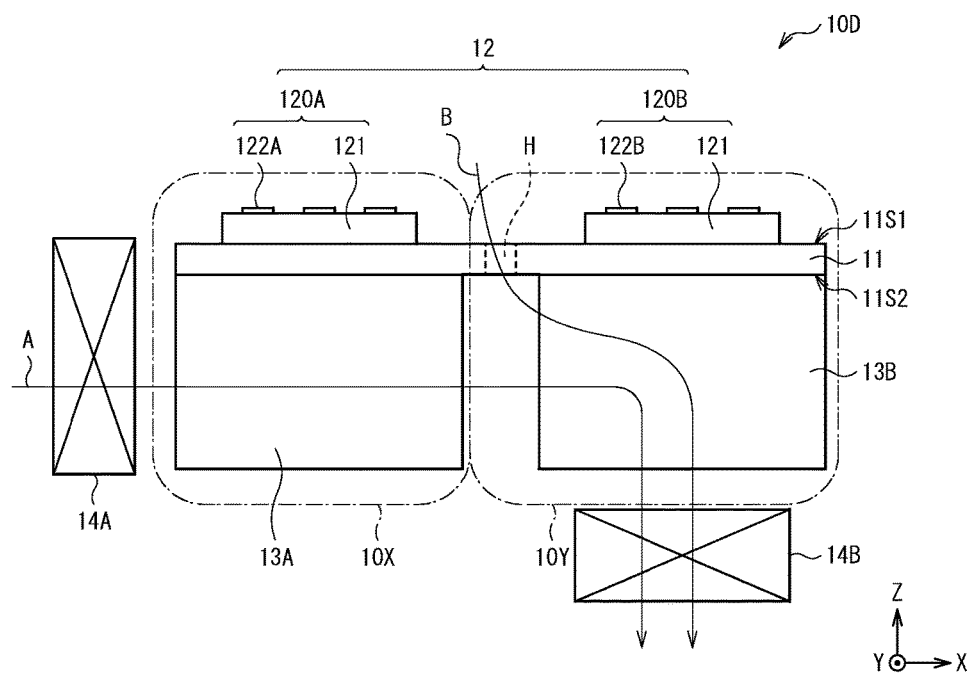
FIG. 11 is a side diagram illustrating an example of a configuration of a light source unit according to a fourth embodiment of the present disclosure.
Figure 12:
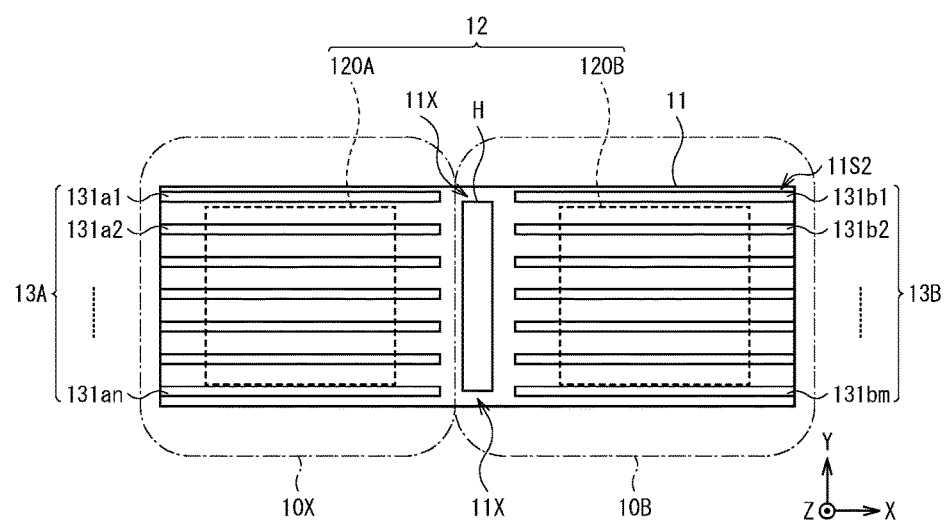
FIG. 12 is a schematic diagram illustrating a configuration of a main part of the light source unit illustrated in FIG. 11.

FIG. 11 illustrates an example of a configuration of a light source unit (a light source unit 10D) according to a fourth embodiment of the present disclosure. FIG. 12 schematically illustrates a configuration of a main part of the light source unit 10D illustrated in FIG. 11. The light source unit 10D is used, for example, as the light source of the projector 1 as with the light source unit 10A according to the first embodiment described above. The light source unit 10D according to the present embodiment differs from the first embodiment described above in that an opening H that penetrates through the upper face (the face 11S1) and the lower face (the face 11S2) is provided on the base member 11 at a position, of the second region 10Y, in proximity to the first region 10X.

In the present embodiment, the heat dissipation member 13B and the opening H provided on the base member 11 correspond to one concrete example of the "second heat dissipation structure" of the present disclosure. Thus, by providing the opening H on the base member 11 between the heat dissipation member 13A and the heat dissipation member 13B, a cold cooling air (an arrow B) taken from the opening H flows into the second region 10Y in addition to the cooling air (the arrow A) warmed in the first region 10X. Thus, as with the first embodiment described above, the temperature difference is reduced between the first region 10X and the second region 10Y, making it possible to improve performance as the light source unit.

It should be noted that a portion of the base member 11 preferably remains at both ends of the opening H as a bridge section 11X that joins the first region 10X side and the second region 10Y side of the base member 11. This enables an optical designing of the light source section 12 of the light source unit 1-D to be ensured. Specifically, it is possible to align the positions of the respective light-emitting element groups 120A and 120B and to manage the parallelism.

Figure 13:
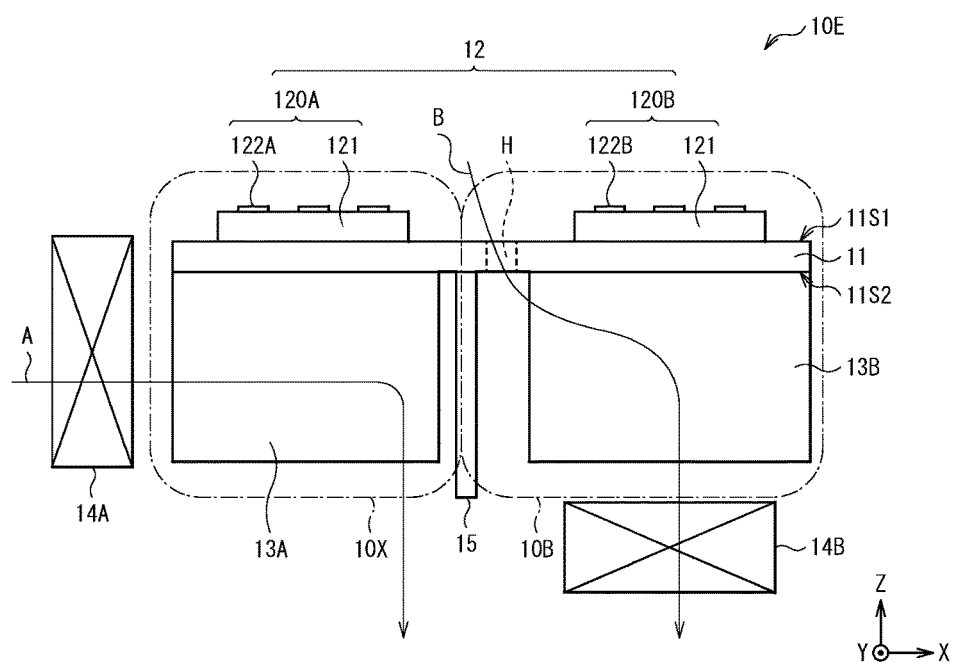
FIG. 13 is a side diagram illustrating another example of the configuration of the light source unit according to the fourth embodiment of the present disclosure.
Figure 14:
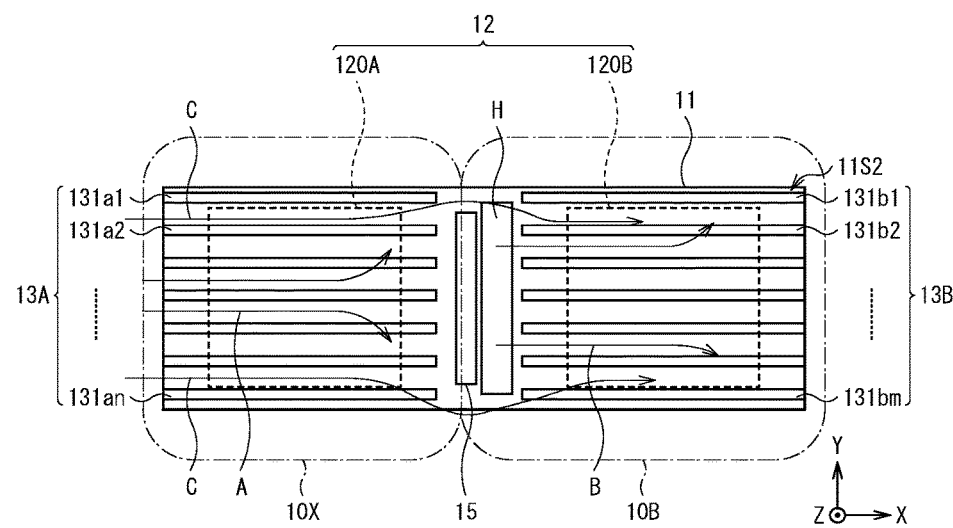
FIG. 14 is a schematic diagram illustrating a configuration of a main part of the light source unit illustrated in FIG. 13.

Further, a flow-adjusting plate 15 may be disposed between the first region 10X and the second region 10Y in front of the opening H, as with a light source unit 10E illustrated in FIGS. 13 and 14. The flow-adjusting plate 15 includes, for example, a pressed component, a mold member such as polycarbonate (PC)/ABS resin, or a polycarbonate sheet. The flow-adjusting plate 15 hinders the flow path of the cooling air, allows the cooling air warmed in the first region 10X to be discharged before the second region 10Y, and allows only the cooling air (the arrow B) taken from the opening H to flow into the second region 10Y. Thus, an influence of an exhaust heat by the first region 10X is suppressed to reduce the temperature difference between the first region 10X and the second region 10Y, making it possible to improve performance as the light source unit.

It should be noted that all of the cooling air (the arrow A) fed from the fan 14A do not have to be discharged in front of the second region 10Y by the flow-adjusting plate 15, and a portion of the cooling air may travel through a side of the flow-adjusting plate 15 to flow into the second region 10Y, as denoted by an arrow C illustrated in FIG. 14, for example.

It should be noted that, in the second to the fourth embodiments described above, the pitches of the respective fins structuring the heat dissipation member 13A and the heat dissipation member 13B do not necessarily have to be the same. In addition, the numbers of respective fins structuring the heat dissipation member 13A and the heat dissipation member 13B do not necessarily have to be the same as well. For example, if the heat dissipation member 13B has a higher heat dissipation characteristic than the heat dissipation member 13A owing to a constituent material of the fins as with the second embodiment, the heat dissipation member 13A may have the plurality of fins 131a1, 131a2, . . . , 131an disposed at a narrower pitch than the heat dissipation member 13B, or may be configured by the larger number of fins (n>m).

5. Modification Examples

5-1. Modification Example 1

Figure 15:
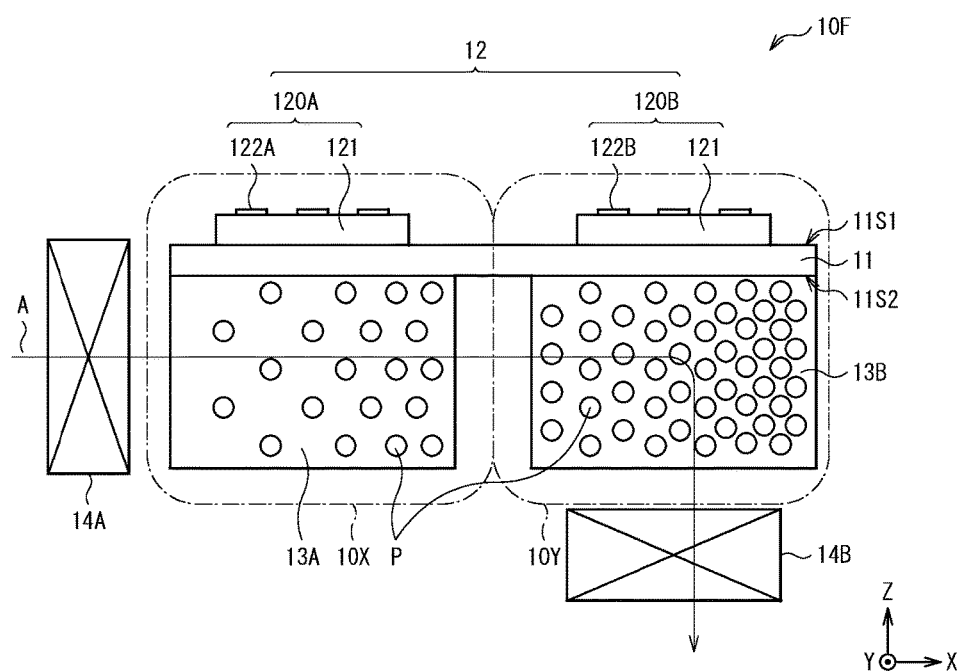
FIG. 15 is a side diagram illustrating an example of a configuration of a light source unit according to modification example 1 of the present disclosure.

FIG. 15 illustrates a configuration of a light source unit (a light source unit 10F) according to modification example 1 of the present disclosure. In the third embodiment described above, an example has been described in which the holes P are provided only on the plurality of fins 131b1, 131b2, . . . , 131bm structuring the heat dissipation member 13B. However, it is not limited thereto. For example, the holes P may be provided on both the heat dissipation member 13A and the heat dissipation member 13B. In such a case, it is preferable that the holes P be formed in such a manner that a hole density in the plane increases from the upstream side to the downstream side as illustrated in FIG. 15, for example. Thus, the temperature difference is reduced between the first region 10X and the second region 10Y while improving the cooling efficiency in the first region 10X, making it possible to improve performance of the light source unit having the same.

5-2. Modification Example 2

Figure 16:
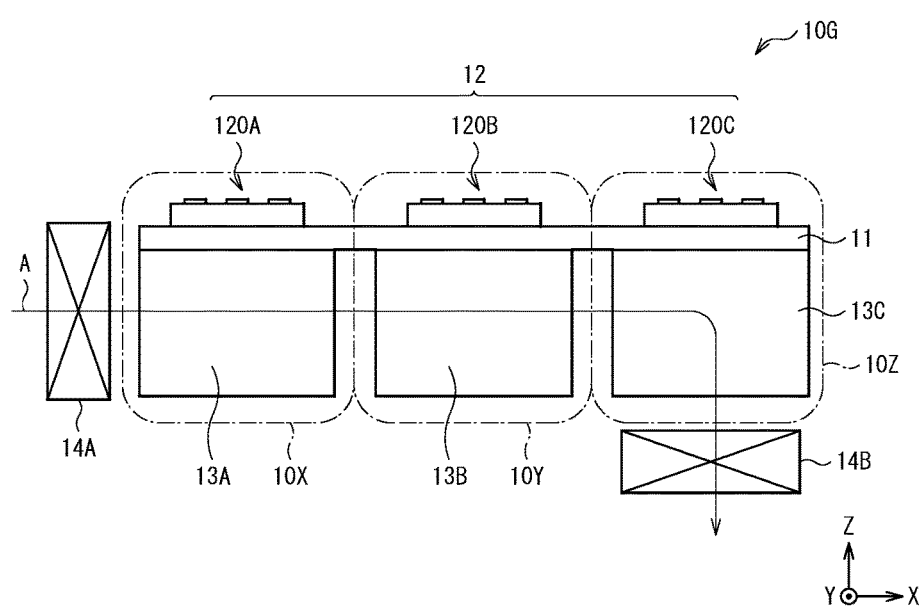
FIG. 16 is a side diagram illustrating an example of a configuration of a light source unit according to modification example 2 of the present disclosure.

FIG. 16 illustrates a side configuration of a light source unit (a light source unit 10G) according to modification example 2 of the present disclosure. In the first embodiment and the like, an example having the two light-emitting element groups 120A and 120B as the light source section 12 is described, but three or more light-emitting element groups (e.g., light-emitting element groups 120A, 120B, and 120C) having substantially the same heat generation amount may be provided. In such a case, it is desirable that, in the first region 10X in which the light-emitting element group 120A is disposed on the upper face (the face 11S1) of the base member 11, the second region 10Y in which the light-emitting element group 120B is disposed on the upper face (the face 11S1) of the base member 11, and a third region 10Z in which the light-emitting element group 120C is disposed on the upper face (the face 11S1) of the base member 11, the heat dissipation members 13A, 13B, and 13C in which the heat dissipation characteristic is improved in a stepwise manner as with the first embodiment and the like described above be disposed in order from the upstream side toward the downstream side as denoted by the arrow A, or that the heat dissipation members 13A, 13B, and 13C in which the heat dissipation characteristic is improved continuously as with the modification example 1 described above be disposed in order from the upstream side toward the downstream side as denoted by the arrow A. Thus, the temperature difference is reduced between the first region 10X, the second region 10Y, and the third region 10Z, making it possible to improve performance of the light source unit having the same.

5-3. Modification Example 3

Figure 17:
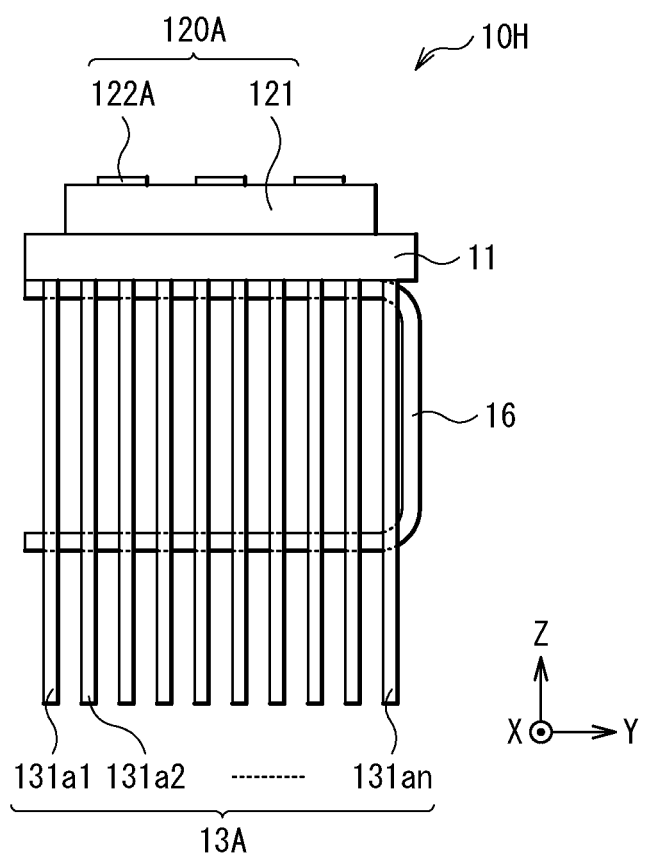
FIG. 17 is a side diagram illustrating a configuration of a main part of a light source unit according to modification example 3 of the present disclosure.

FIG. 17 illustrates a side configuration of a light source unit (a light source unit 10H) according to modification example 3 of the present disclosure. Each of the fins 131a1, 131a2, ..., 131an structuring the heat dissipation member 13A and each of the fins 131b1, 131b2, ..., 131bm structuring the heat dissipation member 13B may be combined with a heat pipe 16 as illustrated in FIG. 17. For example, the heat pipe is so disposed as to penetrate from the fin 131a1 toward the fin 131an and then penetrate from the fin 131an toward the fin 131a1 while being in contact with the base member 11. This promotes a heat transfer from the base member 11 to the heat dissipation member 13A and the heat dissipation member 13B.

In this manner, by combining the plurality of fins 131a1, 131a2, ..., 131an and fins 131b1, 131b2, ..., 131bm with the heat pipe 16 to structure the heat dissipation members 13A and 13B, it is possible to further improve the cooling efficiency in the first region 10X and the second region 10Y.

6. Application Examples

Application Example 1

Figure 18:
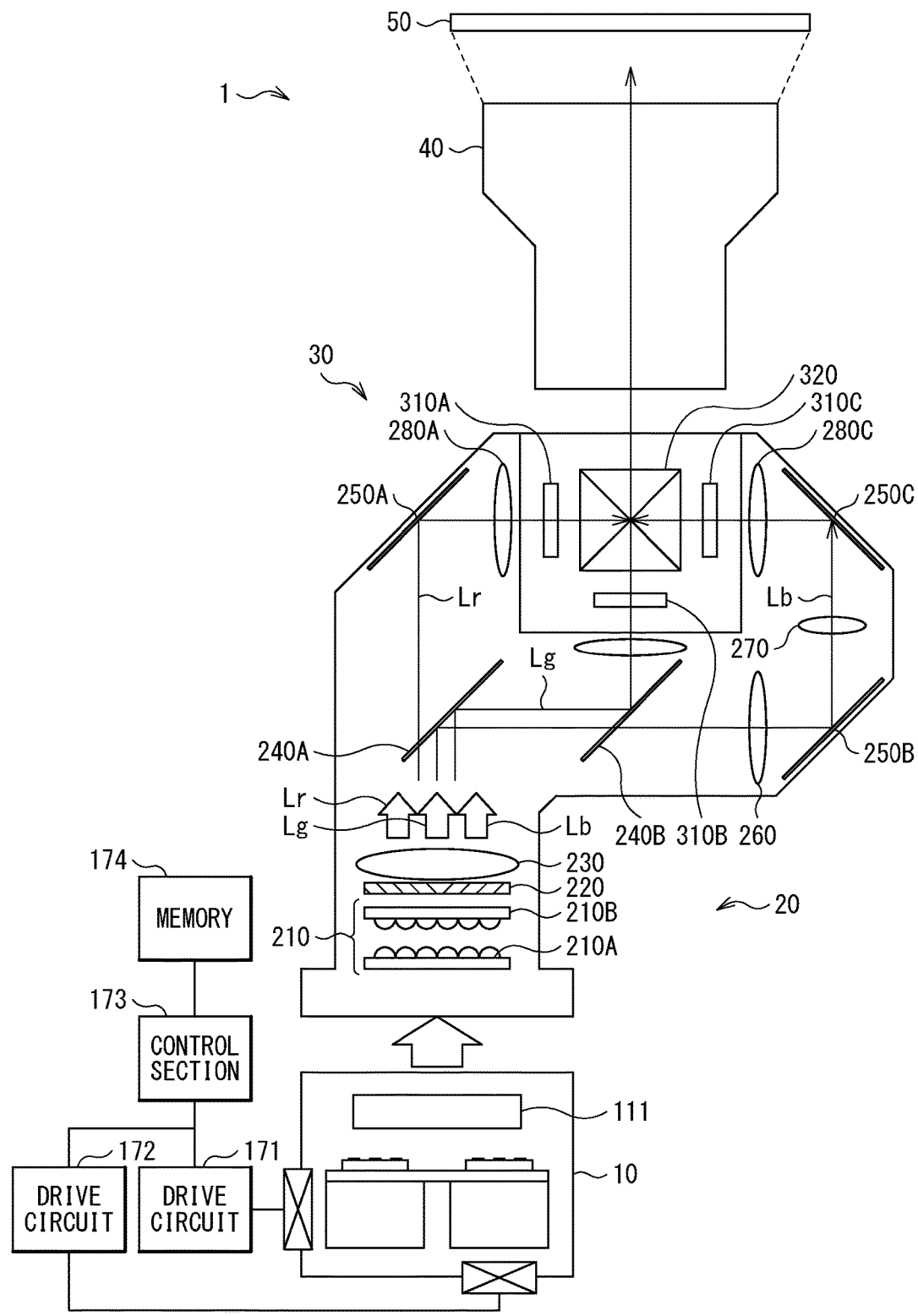
FIG. 18 is a schematic diagram illustrating an example of an overall configuration of a projector according to application example 1 of the present disclosure.

FIG. 18 is a schematic diagram illustrating an example of a configuration of a projection-type display apparatus (a projector 1) of a transmission type 3 LCD system in which an optical modulation is performed by a liquid crystal panel of a transmission type. The projector 1 includes, for example, a light source unit 10, an illumination optical system 20 and an image forming section 30, and a projection optical system 40. It is possible to use the light source units 10A to 10H described in the first to the fourth embodiments and the modification examples 1 to 3 for the light source unit 10.

The illumination optical system 20 has, for example, a fly-eye lens 210 (210A and 210B), a polarization conversion device 220, a lens 230, dichroic mirrors 240A and 240B, reflection mirrors 250A, 250B, and 250C, relay lenses 260 and 270, and field lenses 280A, 280B, and 280C, from a position close to the light source unit 10A.

The fly-eye lens 210 (210A and 210B) uniformizes an illuminance distribution of, for example, white light outputted from the light source unit 10. The polarization conversion device 220 has a function of aligning a polarization state of incident light entering through the fly-eye lens 210. The polarization conversion device 220 outputs output light including blue light Lb, green light Lg, and red light Lr through a lens (not illustrated) disposed on an output side of the light source unit 10, for example. The lens 230 condenses light from the polarization conversion device 220 toward the dichroic mirror 240A.

The dichroic mirrors 240A and 240B selectively reflect light of a predetermined wavelength range and selectively transmits light of other wavelength ranges. For example, the dichroic mirror 240A reflects primarily the green light (Lg) and the blue light (Lb) towards the reflection mirror 250A. In addition, the dichroic mirror 240B reflects primarily the green light (Lg) towards the field lens 20B. Accordingly, the red light (Lr) is mainly transmitted through the dichroic mirror 240A, and the blue light (Lb) is mainly transmitted through the dichroic mirror 240B. Thus, the light (the white light Lw) outputted from the light source unit 10 is separated into a plurality of pieces of color light of different colors.

The separated red light Lr is reflected by the reflection mirror 250A, collimated by passing through the field lens 280A, and then enters a later-described liquid crystal panel 310A for modulating the red light. The green light Lg is collimated by passing through the field lens 280B, and then enters a later-described liquid crystal panel 310B for modulating the green light. The blue light Lb passes through the relay lens 260 and is reflected by the reflection mirror 250B, and further passes through the relay lens 270 and is reflected by the reflection mirror 250C. The blue light Lb reflected by the reflection mirror 250C is collimated by passing through the field lens 280C, and then enters a later-described liquid crystal panel 310C for modulating the blue light Lb.

The image forming section 30 has, for example, the liquid crystal panels 310A to 310C of a transmission type (light modulation devices) and a dichroic prism 320.

The liquid crystal panels 310A to 310C are electrically coupled to an unillustrated signal source (for example, PC, etc.) that supplies an image signal containing image information. The liquid crystal panels 310A to 310C modulate incident light on a pixel-by-pixel basis on the basis of the supplied image signals of the respective colors, and respectively generate a red image, a green image, and a blue image. The modulated pieces of light of the respective colors (formed images) enter the dichroic prism 320 to be synthesized. The dichroic prism 320 superimposes and thus synthesizes the pieces of lights of the respective colors entering from three directions, and outputs the synthesized light toward the projection optical system 40.

The projection optical system 40 includes, for example, an unillustrated plurality of lenses, etc. The projection optical system 40 enlarges output light from the image forming section 30 and projects the enlarged output light onto a screen 50.

Application Example 2

Figure 19:
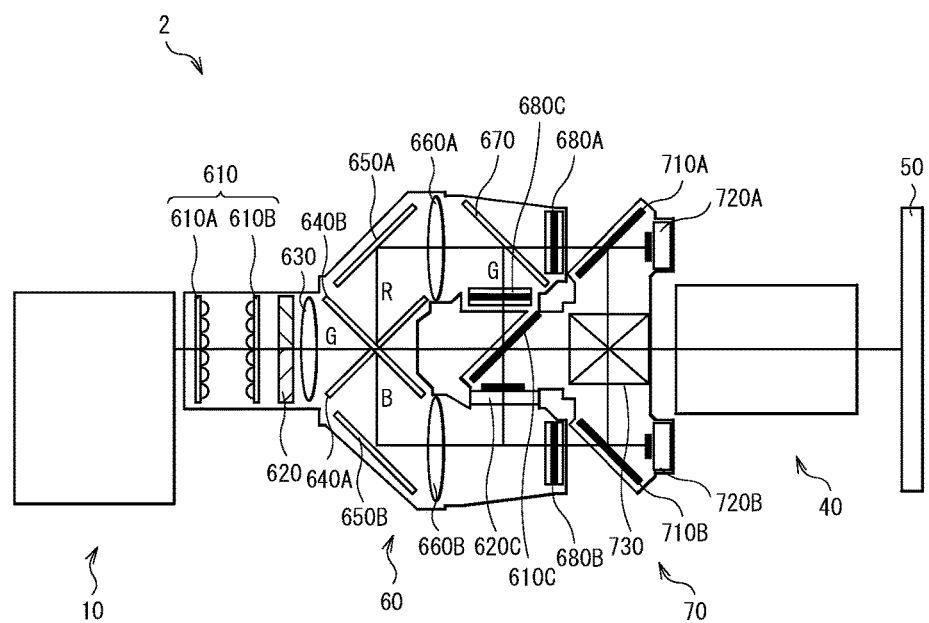
FIG. 19 is a schematic diagram illustrating an example of an overall configuration of a projector according to application example 2 of the present disclosure.

FIG. 19 is a schematic diagram illustrating an example of a projection-type display apparatus (a projector 2) of a reflection type 3 LCD system in which an optical modulation is performed by a liquid crystal panel of a reflection type. The projector 2 includes the light source unit 10, an illumination optical system 60, an image forming section 70, and the projection optical system 40. It should be noted that the projector 2 of the present disclosure may also be applied to a projector that uses a digital micro-mirror device (DMD:

Digital Micro-mirror Device) or the like instead of the reflection-type liquid crystal panel.

The illumination optical system 60 has, for example, a fly-eye lens 610 (610A and 610B), a polarization conversion device 620, a lens 630, dichroic mirrors 640A and 640B, reflection mirrors 650A and 650B, lenses 660A and 660B, a dichroic mirror 670, and polarization plates 680A to 680C from a position close to the light source unit 10A.

The fly-eye lens 610 (610A and 610B) uniformizes an illuminance distribution of white light from the light source unit 10A. The polarization conversion device 620 functions to align a polarization axis of incident light in a predetermined direction. For example, the polarization conversion device 620 converts light other than P-polarized light into P-polarized light. The lens 630 condenses light from the polarization conversion device 620 toward the dichroic mirrors 640A and 640B.

The dichroic mirrors 640A and 640B selectively reflect light of a predetermined wavelength range and selectively transmit light of other wavelength ranges. For example, the dichroic mirror 640A primarily reflects red light towards the reflection mirror 650A. In addition, the dichroic mirror 640B primarily reflects blue light towards the reflection mirror 650B. Accordingly, green light is mainly transmitted through both the dichroic mirrors 640A and 640B and is directed to a reflection-type polarization plate 710C (described later) of the image forming section 70. The reflection mirror 650A reflects light from the dichroic mirror 640A (primarily red light) towards the lens 660A, and the reflection mirror 650B reflects light from the dichroic mirror 640B (primarily blue light) towards the lens 660B. The lens 660A transmits light (primarily red light) from the reflection mirror 650A and condenses the light toward the dichroic mirror 670.

The lens 660B transmits light (primarily blue light) from the reflection mirror 650B and condenses the light toward the dichroic mirror 670. The dichroic mirror 670 selectively reflects the green light and selectively transmits light of other wavelength ranges. Here, the dichroic mirror 670 transmits a red light component of the light from the lens 660A. In a case where a green light component is included in the light from the lens 660A, the dichroic mirror 670 reflects the green light component towards the polarization plate 680C. The polarization plates 680A to 680C include a polarizer having a polarization axis in a predetermined direction. For example, in a case where the light has been converted into the P-polarized light in the polarization conversion device 220, the polarization plates 680A to 680C transmit the P-polarized light and reflect S-polarized light.

The image forming section 70 has reflection-type polarization plates 710A to 710C, reflection-type liquid crystal panels 720A to 720C (light modulation devices), and a dichroic prism 730.

The reflection-type polarization plates 710A to 710C each transmit light of the same polarization axis as polarized light from the polarization plates 680A to 680C (e.g., the P-polarized light) and reflect light of any other polarization axis (S-polarized light). Specifically, the reflection-type polarization plate 710A transmits the red light of the P-polarized light from the polarization plate 680A towards the reflection-type liquid crystal panel 720A. The reflection-type polarization plate 710B transmits the blue light of the P-polarized light from the polarization plate 680B towards reflection-type liquid crystal panel 720B. The reflection-type polarization plate 710C transmits the green light of the P-polarized light from the polarization plate 680C towards the reflection-type liquid crystal panel 720C. In addition, the green light of the P-polarized light that has passed through both the dichroic mirrors 640A and 640B and entered the reflection-type polarization plate 710C is transmitted through the reflection-type polarization plate 710C as it is and enters the dichroic prism 730. Further, the reflection-type polarization plate 710A reflects the S-polarized red light from the reflection-type liquid crystal panel 720A and causes the S-polarized red light to enter the dichroic prism 730. The reflection-type polarization plate 710B reflects the S-polarized blue light from the reflection-type liquid crystal panel 720B and cause the S-polarized blue light to enter the dichroic prism 730. The reflection-type polarization plate 710C reflects the S-polarized green light from the reflection-type liquid crystal panel 720C and causes the S-polarized green light to enter the dichroic prism 730.

The reflection-type liquid crystal panels 720A to 720C each perform a spatial modulation of the red light, the blue light, or the green light. The dichroic prism 730 synthesizes the entered red light, blue light, and green light, and outputs the synthesized light toward the projection optical system 40.

The projection optical system 40 includes, for example, the unillustrated plurality of lenses, etc. The projection optical system 40 enlarges output light from the image forming section 30 and projects the enlarged output light onto the screen 50.

Although the present technology has been described with reference to the first to the fourth embodiments, the modification examples 1 to 3, and the application examples, the present technology is not limited to the above-described embodiments and the like, and various modifications can be made. For example, in the above embodiments and the like, the constituent elements of each optical system are specifically described, but not all the constituent elements do not have to be provided, and any other constituent element may be further provided.

In addition, in the above embodiments and the like, an example in which the fan 14A and the fan 14B are orthogonally disposed has been described. However, it is not limited thereto. For example, the fan 14A and the fan 14B may be disposed on a straight line.

Further, for example, in the projector 1 illustrated in FIG. 18, a polarization beam splitter (PBS), a color synthesizing prism that synthesizes picture signals of respective colors of R, G, and B, a TIR (Total Internal Reflection) prism, or the like may be used instead of the dichroic prism 320.

Furthermore, as a projection-type display apparatus according to the present technology, a device other than the projector described above may be configured.

It should be noted that the effects described in the present specification are merely examples and are not limited thereto. Moreover, other effects may be included.

In addition, it is possible for the present technology to have the configurations as follows. According to the present technology of the following configurations, the second heat dissipation structure having the higher heat dissipation efficiency than the first heat dissipation structure disposed in the first region is provided in the second region in which the second light-emitting element group having substantially the same heat generation amount as the first light-emitting element group is disposed. Thus, the cooling efficiency in the second region is improved. Hence, it is possible to reduce the temperature difference between the first region and the second region and to improve the performance.

(1)
A light source unit including:
a base member having one face and another face that face each other, and having a first region and a second region that are disposed side by side;
a first light-emitting element group disposed in the first region of the one face;
a second light-emitting element group disposed in the second region of the one face, and having substantially the same heat generation amount as the first light-emitting element group;
a first heat dissipation structure provided in the first region; and
a second heat dissipation structure provided in the second region, and having a heat dissipation characteristic equal to or greater than a heat dissipation characteristic of the first heat dissipation structure.

(2)
The light source unit according to (1), further including a cooling mechanism, in which
the first region and the second region are disposed in this order on a flow path of a cooling gas configured to be fed from the cooling mechanism.

(3)
The light source unit according to (1) or (2), in which
the first heat dissipation structure and the second heat dissipation structure are configured by one or a plurality of fins disposed on the other face, and
a surface area of the one or the plurality of fins structuring the second heat dissipation structure is larger than a surface area of the one or the plurality of fins structuring the first heat dissipation structure.

(4)
The light source unit according to (3), in which the second heat dissipation structure has the plurality of fins disposed more densely than the first heat dissipation structure.

(5)
The light source unit according to (3) or (4), in which the one or the plurality of fins structuring the second heat dissipation structure has a hole.

(6)
The light source unit according to (5), in which the hole satisfies d<2t (where d: a hole diameter and t: a fin thickness).

(7)
The light source unit according to any one of (1) to (6), in which
the first heat dissipation structure and the second heat dissipation structure are configured by one or a plurality of fins disposed on the other face, and
a thermal conductivity of the one or the plurality of fins structuring the second heat dissipation structure is higher than a thermal conductivity of the one or the plurality of fins structuring the first heat dissipation structure.

(8)
The light source unit according to (7), in which the one or the plurality of fins disposed in the second region includes a material having the thermal conductivity higher than the thermal conductivity of the one or the plurality of fins disposed in the first region.

(9)
The light source unit according to any one of (3) to (8), further including a heat pipe, in which
the heat pipe penetrates the one or the plurality of fins.

(10)
The light source unit according to any one of (1) to (9), in which the base member has an opening at a position, of the second region, in proximity to the first region.

(11)
The light source unit according to (10), in which the base member further includes a flow-adjusting plate provided on the other face on a side closer to the first region than the opening.

(12)
The light source unit according to any one of (1) to (11), in which the first light-emitting element group and the second light-emitting element group have one or a plurality of light-emitting elements.

(13)
A projection-type display apparatus including:
a light source unit;
an image generation optical system that generates image light, by modulating light from the light source unit on the basis of an inputted image signal; and
a projection optical system that projects the image light generated by the image generation optical system, in which
the light source unit includes
a base member having one face and another face that face each other, and having a first region and a second region that are disposed side by side,
a first light-emitting element group disposed in the first region of the one face,
a second light-emitting element group disposed in the second region of the one face, and having substantially the same heat generation amount as the first light-emitting element group,
a first heat dissipation structure provided in the first region, and
a second heat dissipation structure provided in the second region, and having a heat dissipation characteristic greater than a heat dissipation characteristic of the first heat dissipation structure.

(14)
A light source unit including:
a base member having one face and another face that face each other;
a first light-emitting element group disposed in the first region of the one face;
a second light-emitting element group disposed in the second region of the one face, and having substantially the same heat generation amount as the first light-emitting element group;
a first heat dissipation structure provided at a position, of the other face, corresponding to the first light-emitting element group; and
a second heat dissipation structure provided at a position, of the other face, corresponding to the second light-emitting element group, and having a heat dissipation characteristic greater than a heat dissipation characteristic of the first heat dissipation structure.

(15)
A light source unit including:
a base member having one face and another face that face each other;
a first light-emitting element group disposed in the first region of the one face;
a second light-emitting element group disposed in the second region of the one face, and having substantially the same heat generation amount as the first light-emitting element group; and an opening that penetrates the one face and the other face of the base member between the first light-emitting element group and the second light-emitting element group.

The present application claims the benefit of Japanese Priority Patent Application JP2019-027480 filed with the Japan Patent Office on Feb. 19, 2019, the entire contents of which are incorporated herein by reference.

It should be understood by those skilled in the art that various modifications, combinations, sub-combinations and alterations may occur depending on design requirements and other factors insofar as they are within the scope of the appended claims or the equivalents thereof.

The invention claimed is:

1. A light source unit comprising:
 a base member having one face and another face that face each other, and having a first region and a second region that are disposed side by side;
 a first light-emitting element group disposed in the first region of the one face;
 a second light-emitting element group disposed in the second region of the one face, and having substantially the same heat generation amount as the first light-emitting element group;
 a first heat dissipation structure provided in the first region on an upstream side; and
 a second heat dissipation structure provided in the second region on a downstream side, and having a heat dissipation characteristic equal to or greater than a heat dissipation characteristic of the first heat dissipation structure,
 wherein each of the first heat dissipation structure and the second heat dissipation structure is configured by a plurality of fins disposed on the other face of the base member,
 wherein a plurality of holes are provided on both the first heat dissipation structure and the second heat dissipation structure such that a density of the plurality of holes increases from the upstream side to the downstream side, and
 wherein the plurality of fins structuring the second heat dissipation structure is disposed more densely than the plurality of fins structuring the first heat dissipation structure.

2. The light source unit according to claim 1, further comprising a cooling mechanism, wherein
 the first region and the second region are disposed in an order on a flow path of a cooling gas configured to be fed from the cooling mechanism.

3. The light source unit according to claim 1, wherein
 a surface area of the plurality of fins structuring the second heat dissipation structure is larger than a surface area of the plurality of fins structuring the first heat dissipation structure.

4. The light source unit according to claim 1, wherein each hole of the plurality of the holes satisfies d<2t (where d: a hole diameter and t: a fin thickness).

5. The light source unit according to claim 1, wherein
 a thermal conductivity of the plurality of fins structuring the second heat dissipation structure is higher than a thermal conductivity of the plurality of fins structuring the first heat dissipation structure.

6. The light source unit according to claim 5, wherein the plurality of fins disposed in the second region includes a material having the thermal conductivity higher than the thermal conductivity of the plurality of fins disposed in the first region.

7. The light source unit according to claim 1, further comprising a heat pipe, wherein
 the heat pipe penetrates the plurality of fins while being in contact with the base member.

8. The light source unit according to claim 1, wherein the base member has an opening at a position, of the second region, in proximity to the first region.

9. The light source unit according to claim 8, wherein the base member further includes a flow-adjusting plate provided on the other face on a side closer to the first region than the opening.

10. The light source unit according to claim 1, wherein the first light-emitting element group and the second light-emitting element group have one or a plurality of light-emitting elements.

11. The light source unit according to claim 1, wherein a pitch of the plurality of fins of the second heat dissipation structure is narrower than a pitch of the plurality of fins on the first heat dissipation structure.

12. The light source unit according to claim 1, further comprising a cooling mechanism, wherein the cooling mechanism includes:
 a first fan disposed on a side of the first region, and
 a second fan disposed on a side of the second region, and
 wherein air generated by the first fan and the second fan is fed from the first region to the second region.

13. The light source unit according to claim 1, wherein the base member further includes a flow-adjusting plate disposed between the first region and the second region.

14. The light source unit according to claim 13, wherein the flow-adjusting plate includes a pressed component, a mold member such as polycarbonate (PC)/ABS resin, or a polycarbonate sheet.

15. A projection-type display apparatus comprising:
 a light source unit;
 an image generation optical system that generates image light, by modulating light from the light source unit on a basis of an inputted image signal; and
 a projection optical system that projects the image light generated by the image generation optical system, wherein
 the light source unit includes:
  a base member having one face and another face that face each other, and having a first region and a second region that are disposed side by side,
  a first light-emitting element group disposed in the first region of the one face,
  a second light-emitting element group disposed in the second region of the one face, and having substantially the same heat generation amount as the first light-emitting element group,
  a first heat dissipation structure provided in the first region on an upstream side, and
  a second heat dissipation structure provided in the second region on a downstream side, and having a heat dissipation characteristic greater than a heat dissipation characteristic of the first heat dissipation structure,
  wherein each of the first heat dissipation structure and the second heat dissipation structure is configured by a plurality of fins disposed on the other face of the base member,
  wherein a plurality of holes are provided on both the first heat dissipation structure and the second heat dissipation structure such that a density of the plurality of holes increases from the upstream side to the downstream side, and wherein the plurality of fins structuring the second heat dissipation structure is disposed more densely than the plurality of fins structuring the first heat dissipation structure.

* * * * *